(12) United States Patent
Kroener et al.

(10) Patent No.: US 9,092,712 B2
(45) Date of Patent: Jul. 28, 2015

(54) EMBEDDED HIGH FREQUENCY RFID

(71) Applicant: Flextronics AP, LLC, Broomfield, CO (US)

(72) Inventors: Helmut Kroener, Schongau (DE); Peter Sartorius, Gaufelden-Nebringen (DE)

(73) Assignee: Flextronics AP, LLC, Broomfield, CO (US)

( * ) Notice: Subject to any disclaimer, the term of this patent is extended or adjusted under 35 U.S.C. 154(b) by 0 days.

(21) Appl. No.: 14/065,318

(22) Filed: Oct. 28, 2013

(65) Prior Publication Data

US 2014/0124582 A1 May 8, 2014

Related U.S. Application Data

(60) Provisional application No. 61/721,960, filed on Nov. 2, 2012.

(51) Int. Cl.
- *G06K 19/00* (2006.01)
- *G06K 19/077* (2006.01)
- *G06K 19/07* (2006.01)

(52) U.S. Cl.
CPC ...... *G06K 19/07745* (2013.01); *G06K 19/0723* (2013.01); *H01L 2224/48091* (2013.01); *Y10T 29/49018* (2015.01)

(58) Field of Classification Search
USPC .................................. 235/487, 492; 726/34
See application file for complete search history.

(56) References Cited

U.S. PATENT DOCUMENTS

| | | |
|---|---|---|
| 4,069,497 A | 1/1978 | Steidlitz |
| 4,712,160 A | 12/1987 | Sato et al. |
| 4,899,256 A | 2/1990 | Sway |
| 5,101,322 A | 3/1992 | Ghaem et al. |
| 5,235,491 A | 8/1993 | Weiss |
| 5,272,599 A | 12/1993 | Koenen |
| 5,295,044 A | 3/1994 | Araki et al. |
| 5,365,403 A | 11/1994 | Vinciarelli et al. |
| 5,536,677 A | 7/1996 | Hubacher |
| 5,838,554 A | 11/1998 | Lanni |
| 5,872,051 A | 2/1999 | Fallon et al. |
| 5,873,512 A | 2/1999 | Bielick et al. |
| 5,920,458 A | 7/1999 | Azar |
| 5,933,324 A | 8/1999 | Barrett |
| 6,189,771 B1 | 2/2001 | Maeda et al. |
| 6,198,367 B1 | 3/2001 | Matsunaga et al. |
| 6,243,269 B1 | 6/2001 | Dibene, II et al. |
| 6,245,595 B1 | 6/2001 | Nguyen |
| 6,272,015 B1 | 8/2001 | Mangtani |
| 6,282,092 B1 | 8/2001 | Okamoto et al. |
| 6,311,139 B1 | 10/2001 | Kuroda et al. |
| 6,369,328 B1 | 4/2002 | Munakata |
| 6,549,409 B1 | 4/2003 | Saxelby et al. |

(Continued)

*Primary Examiner* — Allyson Trail

(74) *Attorney, Agent, or Firm* — Haverstock & Owens LLP

(57) ABSTRACT

An embedded high frequency RFID system, method and device comprises a PCB having a non-conductive substrate and conductive traces on the substrate. The non-conductive substrate mechanically supports the PCB and the conductive traces electrically couple electronic components (e.g. microchips, resistors, capacitors) on the board together such that the PCB is able to operate. Additionally, the PCB beneficially comprises a high frequency RFID tag that is embedded within the PCB itself and locked in place by a non-conductive adhesive. As a result, the embedded high frequency RFID system, method and device enables each PCB to store data which gives each PCB sold to a customer a unique ID, which can be read over the life of the product.

31 Claims, 3 Drawing Sheets

(56) References Cited

U.S. PATENT DOCUMENTS

| | | |
|---|---|---|
| 6,627,993 B1 | 9/2003 | Shen |
| 6,775,162 B2 | 8/2004 | Mihai et al. |
| 6,795,315 B1 | 9/2004 | Wu et al. |
| 7,208,833 B2 | 4/2007 | Nobori et al. |
| 7,676,775 B2 | 3/2010 | Chen et al. |
| 8,707,221 B2 | 4/2014 | Durkan |
| 2001/0003427 A1 | 6/2001 | Ferguson et al. |
| 2001/0018263 A1 | 8/2001 | Ochiai et al. |
| 2001/0045297 A1 | 11/2001 | Miller et al. |
| 2002/0008963 A1 | 1/2002 | DiBene, II et al. |
| 2002/0092160 A1 | 7/2002 | McCullough |
| 2004/0122606 A1 | 6/2004 | Cohen et al. |
| 2004/0144527 A1 | 7/2004 | Yang et al. |
| 2005/0246590 A1 | 11/2005 | Lancaster |
| 2006/0196642 A1 | 9/2006 | Gharib |
| 2007/0198548 A1 | 8/2007 | Lee |
| 2007/0273011 A1 | 11/2007 | Singleton et al. |
| 2008/0217768 A1 | 9/2008 | Miranda et al. |
| 2008/0224026 A1 | 9/2008 | Pasternak |
| 2008/0301597 A1 | 12/2008 | Chen et al. |
| 2009/0014501 A1 | 1/2009 | Nishi et al. |
| 2009/0265155 A1 | 10/2009 | Yokogawa |
| 2010/0230672 A1* | 9/2010 | Schnitt ............ 257/48 |
| 2011/0307752 A1 | 12/2011 | Fuji et al. |
| 2012/0286936 A1* | 11/2012 | Mullen et al. ............ 340/10.2 |
| 2013/0299597 A1* | 11/2013 | Sinnett et al. ............ 235/492 |
| 2014/0047567 A1* | 2/2014 | Haselsteiner et al. ......... 726/34 |

\* cited by examiner

EMBEDDED HIGH FREQUENCY RFID

CROSS-REFERENCE TO RELATED APPLICATION

The present application claims priority under 35 U.S.C. 119 to U.S. Provisional Application No. 61/721,960, entitled "EMBEDDED HF RFID," filed on Nov. 2, 2012, the contents of which are incorporated herein as if set forth in full.

FIELD OF THE INVENTION

The present invention relates to the field of high frequency radio frequency identification (RFID). More particularly, the present invention relates to printed circuit boards with embedded high frequency RFID tags.

BACKGROUND

Printed circuit boards (PCB) are key components in almost any application in the electronic industry. Yet, as manufactured, this component of an electronic or electrical system has no counterfeit protection and cannot be easily recognized automatically. As a result, barcodes are often used to identify a PCB. Generally, the barcodes are etched into the surface of the PCB or attached to the surface of the PCB with as a barcode sticker. However, the etched barcodes require significant space on the PCB and the sticker barcodes must be attached manually to the surface of the PCBs and can therefore be easily tampered with and/or removed.

As a result, the barcodes often fail to last through the entire life of the PCB without being removed or otherwise damaged such that the PCBs can no longer be adequately identified. As an alternative, some companies have turned to utilizing radio frequency identification (RFID) tags instead of barcodes. In order to achieve this, the companies add the tag to the other components on their PCB. Specifically, an RFID chip of the tag is coupled to the surface of the PCB via conductive adhesive or soldering and an antenna of the tag is printed on the surface of the RFID chip. However, like the barcodes, these RFID tags are able to be damaged and/or removed and thus tend to fail during the lifetime of the PCB.

SUMMARY OF THE INVENTION

An embedded high frequency RFID system, method and device comprises a PCB having a non-conductive substrate and conductive traces on the substrate. The non-conductive substrate mechanically supports the PCB and the conductive traces electrically couple electronic components (e.g. microchips, resistors, capacitors) on the board together such that the PCB is able to operate. Additionally, the PCB beneficially comprises a high frequency RFID tag that is embedded within the PCB itself and locked in place by a non-conductive adhesive. As a result, the embedded high frequency RFID system, method and device enables each PCB to store data which gives each PCB sold to a customer a unique ID, which can be read over the life of the product. In particular, the tag is protected from damage and removal because it is sealed within the PCB itself and not just exposed on the surface of the PCB. Further, the embedded tag within the PCB is able to be read wirelessly and store data that is used to track the PCB through the entire production chain from the shipment stage all the way to the end product. The stored data is able to include how, when and where the PCB and/or chips on the PCB were tested, which can be used to determine the effectiveness of locations and testing procedures as well as locating faults that cause product defects. Moreover, the unique ID/stored information is able to be used to access PCB production, quality and/or serviceability data stored in a PCB database that references each unique ID to data about the PCB in which the tag is embedded.

A first aspect is directed to an RFID-embedded printed circuit board. The printed circuit board comprises a board having a non-conductive substrate and one or more conductive traces, one or more electronic components coupled to the board, wherein the non-conductive substrate mechanically supports and the conductive traces electrically couple to the one or more electronic components, and a high frequency RFID tag embedded within a cavity of the non-conductive substrate of the board. The tag is able to be affixed within the cavity with a cavity adhesive that couples the tag to the board. The tag is able to comprise a first antenna and a second antenna formed on opposite sides of a flexible tag substrate and electrically coupled together through the flexible tag substrate by a via. The tag is able to comprise a RFID chip electrically coupled to the first and second antennas and the flexible tag substrate by a conductive adhesive. The first and second antennas are able to be uncoated on the flexible tag substrate such that the cavity adhesive is directly contacts the antennas. The tag is able to be a passive tag such that the tag is solely powered by incoming electromagnetic signals received by one or more of the antennas. The cavity is able to have a depth between 200 and 300 micrometers and the first and second antennas have a thickness between 5 and 10 micrometers. The bottom of the cavity of the non-conductive substrate is able to comprise one or more through holes that each create conduits from the cavity through the non-conductive substrate to the opposite side of the non-conductive substrate. The cavity adhesive is able to surround at least the top of the tag to protect the tag and seal the tag within the cavity. The tag is able to store an identifier that uniquely identifies the printed circuit board.

A second aspect is directed to a method of manufacturing an embedded RFID printed circuit board. The method comprises providing a board comprising a non-conductive substrate and one or more conductive traces, coupling one or more electronic components coupled to the board, wherein the non-conductive substrate mechanically supports and the conductive traces electrically couple to the one or more electronic components, producing a cavity within the non-conductive substrate of the board and embedding a high frequency RFID tag within the cavity of the non-conductive substrate of the board. The method is able to further comprise affixing the tag within the cavity with a cavity adhesive that couples the tag to the board. The tag is able to comprise a first antenna and a second antenna formed on opposite sides of a flexible tag substrate and electrically coupled together through the flexible tag substrate by a via. The tag is able to comprise a RFID chip electrically coupled to the first and second antennas and the flexible tag substrate by a conductive adhesive. The first and second antennas are able to be uncoated on the flexible tag substrate such that the cavity adhesive is directly contacts the antennas. The tag is able to be a passive tag such that the tag is solely powered by incoming electromagnetic signals received by one or more of the antennas. The cavity is able to have a depth between 200 and 300 micrometers and the first and second antennas have a thickness between 5 and 10 micrometers. The method is able to further comprise forming one or more through holes in the bottom of the cavity of the non-conductive substrate that each form conduits from the cavity through the non-conductive substrate to the opposite side of the non-conductive substrate. The cavity adhesive is able to surround at least the top of the tag to protect the tag and seal the tag within the cavity. The tag is able to store an identifier that uniquely identifies the printed circuit board. The method is able to further comprise testing the board, the electronic components and the tag for defects before coupling the embedding the tag within the board.

Another aspect is directed to an RFID system. The system comprises a board having a non-conductive substrate and one or more conductive traces, one or more electronic components coupled to the board, wherein the non-conductive substrate mechanically supports and the conductive traces electrically couple to the one or more electronic components, a high frequency RFID tag embedded within a cavity of the non-conductive substrate of the board and storing data and a tag reader that is able to read the data stored on the high frequency RFID tag. The tag is able to be affixed within the cavity with a cavity adhesive that couples the tag to the board. The tag is able to comprise a first antenna and a second antenna formed on opposite sides of a flexible tag substrate and electrically coupled together through the flexible tag substrate by a via. The tag is able to comprise a RFID chip electrically coupled to the first and second antennas and the flexible tag substrate by a conductive adhesive. The first and second antennas are able to be uncoated on the flexible tag substrate such that the cavity adhesive is directly contacts the antennas. The tag is able to be a passive tag such that the tag is solely powered by incoming electromagnetic signals received by one or more of the antennas. The cavity is able to have a depth between 200 and 300 micrometers and the first and second antennas have a thickness between 5 and 10 micrometers. The bottom of the cavity of the non-conductive substrate is able to comprise one or more through holes that each create conduits from the cavity through the non-conductive substrate to the opposite side of the non-conductive substrate. The cavity adhesive is able to surround at least the top of the tag to protect the tag and seal the tag within the cavity. The data is able to comprise an identifier that uniquely identifies the printed circuit board.

Other features of the present invention will become apparent from consideration of the following description taken in conjunction with the accompanying drawings.

BRIEF DESCRIPTION OF THE DRAWINGS

The novel features of the invention are set forth in the appended claims. However, for purposes of explanation, several embodiments of the invention are set forth in the following figures.

DETAILED DESCRIPTION

In the following description, numerous details and alternatives are set forth for the purpose of explanation. However, one of ordinary skill in the art will realize that the invention can be practiced without the use of these specific details. In other instances, well-known structures and devices are shown in block diagram form in order not to obscure the description of the invention with unnecessary detail.

The embedded RFID system, method and device described herein is designed to provide an inexpensive manner to track printed circuit boards or other products throughout the lifetime of the product.

Figure 1:
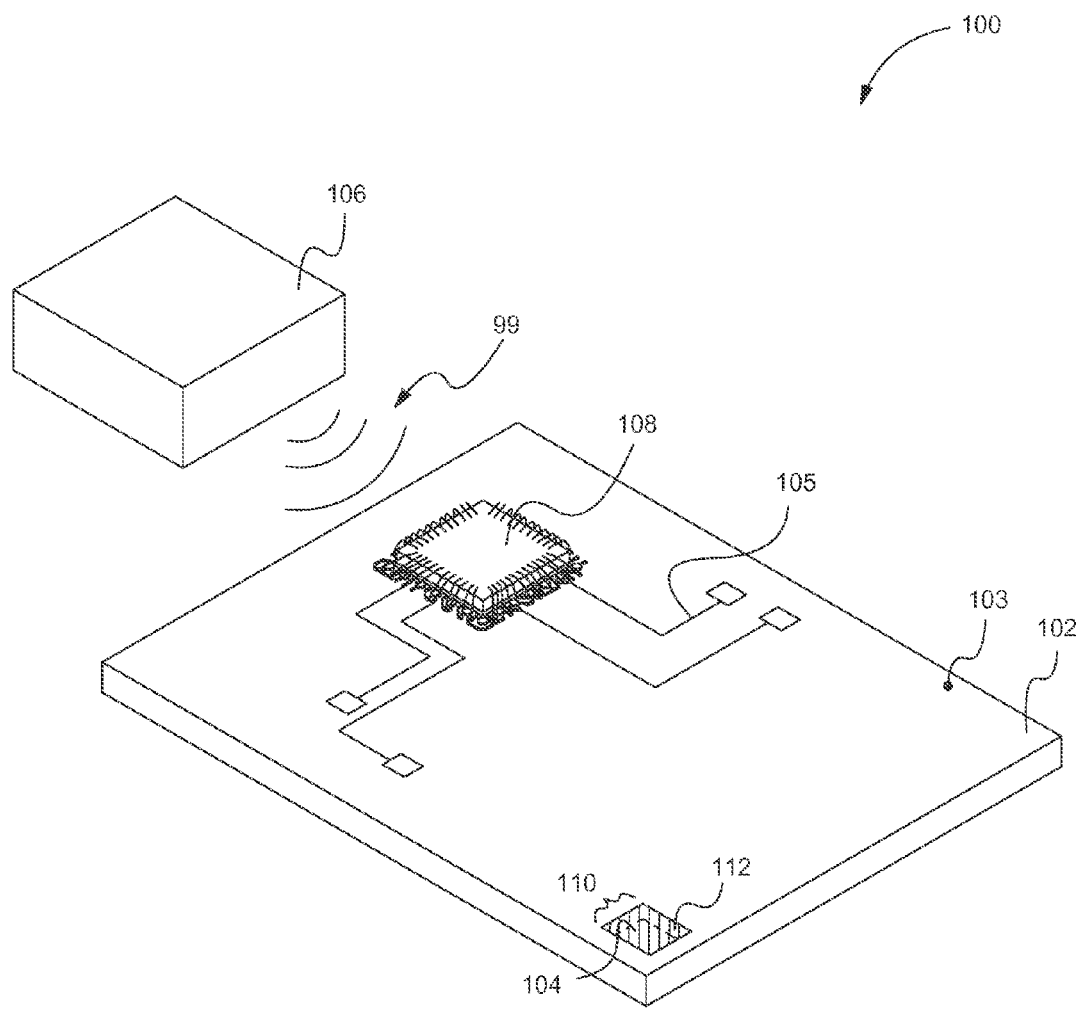
FIG. 1 illustrates an embedded high frequency RFID system according to some embodiments.

FIG. 1 illustrates an embedded high frequency RFID system 100 according to some embodiments. As shown in FIG. 1, the system 100 comprises a printed circuit board 102 having an embedded RFID tag 104 and in communication with an RFID tag reader 106. The tag 104 is sealed within a cavity 110 of the non-conductive substrate 103 with an adhesive material 112. In particular, the adhesive material 112 is able to comprise one or more polyurethane, acrylics, epoxies, other types of adhesives or a combination thereof. In some embodiments, the adhesive material 112 fully covers or encapsulates the tag 104 and/or fills the cavity 110 such that the tag 104 is not exposed from the surface of the substrate 103. Alternatively, one or more portions of the tag 104 are able to be exposed and/or the adhesive material 112 is able to fill only a portion of the cavity 110. The printed circuit board 102 is able to comprise a rigid or semi-rigid non-conductive substrate 103, one or more conductive portions 105 (e.g. traces), and/or one or more electrical components 108 (e.g. microchip, diode, capacitor, resistor, inductor, amplifier). The conductive portions 105 electrically couple with the one or more electrical components 108 and the non-conductive substrate provides mechanical support for the conductive portions 105 and/or electrical components 108. The non-conductive substrate 103 is able to comprise one or more laminates such as L4 and/or other types of non-conductive material. The conductive portions 105 are able to comprise copper and/or other conductive materials (e.g. palladium, gold, silver).

The tag 104 and/or cavity 110 are able to positioned anywhere within the printed circuit board 102, however the tag 104 (and thus the cavity 110) is able to beneficially be located away from some or all of the electrical components 108 and/or the conductive portions 105. In particular, by the distance between the tag 104 and the electrical components 108 and/or the conductive portions 105 is able to reduce interference with radio frequency signals 99 transmitted between the tag reader 106 and the tag 104. For example, as shown in FIG. 1, the surface above (and below) the tag 104 is able to be free of electrical components 108 and/or conductive portions 105 to reduce the chance of interference with the signals 99. The cavity 110 is able to have depth that is slightly greater than the width of the tag 104 which is generally between 50 and 100 micrometers. In some embodiments, the depth of the cavity 110 is between 200 and 300 micrometers. Alternatively, the cavity 110 is able to have other or varying depths as desired. Additionally, the cavity 110 is able to have a perimeter and shape such that the cavity 110 is able to fit the tag 104. For example, if the tag 104 is a flat square, the cavity 110 is able to be a slightly larger flat square or other larger shape that will fit the square. In some embodiments, the cavity 110 comprises one or more apertures or holes (not shown) that create openings or conduits between the inside of the cavity 110 through the printed circuit board 102 (e.g. the non-conductive substrate 103) to the other side of the printed circuit board 102. In such embodiments, these holes enable air to be vented after the tag 104 is embedded in the cavity 110 and sealed by the adhesive 112.

The tag reader 106 is able to be any type of radio frequency tag reader capable of wirelessly reading RFID tags (e.g. passive, semi-passive and/or active tags). Although as shown in FIG. 1, the printed circuit board 102 comprises a single tag 104 and a single electrical component 108, any number of tags 104 and/or electrical components 108 are able to be used.

Additionally, one or more portions of the non-conductive substrate 103 and/or the remainder of the printed circuit board are able to be flexible.

Figure 2:
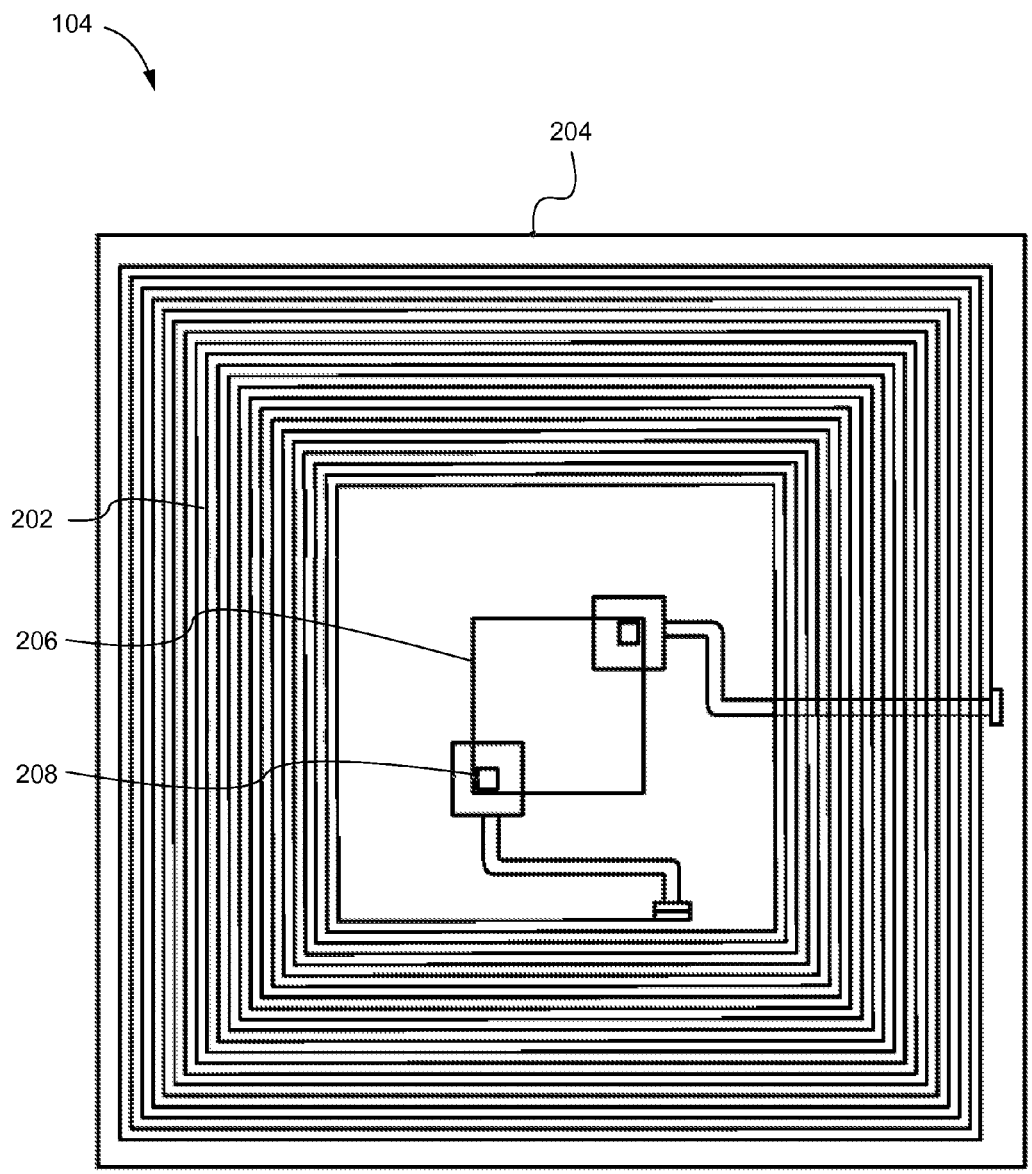
FIG. 2 illustrates a functional block diagram of a embedded RFID system in accordance with some embodiments of the present application.

Figure 2 illustrates the high frequency RFID tag 104 according to some embodiments. As shown in FIG. 2, the tag 104 comprises one or more antennas or inductor coils 202, an insulated tag substrate 204, tag circuitry 206 (e.g. silicon or other type of microchip) and one or more contact pads 208. Alternatively, the tag 104 is able to comprise more or less components. In some embodiments, the tag substrate 204 is made of polyimide. Alternatively, the tag substrate 204 is able to comprise one or more of polyethylene terephthalate (PET), polycarbonate (PC), polyethylene naphthalate (PEN), liquid crystal polymer (LCP), mylar, paper, plastic, kapton, polyimide, or the like, or any combination thereof. In some embodiments, the tag substrate 204 is flexible and have a thickness of 50 micrometers. Alternatively, one or more portions of the tag substrate 204 are able to be rigid and/or have greater or smaller thicknesses. The tag circuitry 206 is coupled to substrate 204 and/or contact pads 208 with a conductive adhesive material. In some embodiments, the conductive adhesive material is an anisotropic conductive paste. Alternatively, other conductive adhesives are able to be used. The conductive adhesive material is able to be filled or unfilled. For example, the adhesive material is able to be filled with one or more conductive particles such as NiAu particles. Alternatively, other types of filler are able to be used. The tag 104 is able to comprise two antennas 202 that are able to be disposed on a top and bottom surface of an insulated tag substrate 204. In particular, in such embodiments, the tag 104 is able to comprise one or more vias (not shown) that electrically couple the antenna 202 on the top side to the antenna 202 on the bottom side. Indeed, in order to reduce the size of the tag 104, the vias are able to be 1 mil. microvias. Alternatively, vias of other sizes are able to be used. Alternatively, a single antenna 202 is able to be used such that vias are not required.

In order to reduce the size of the tag 104, the antennas 202 are able to have a thickness of just 5 to 10 micrometers which allows the wires of the antennas 202 to be more closely placed together. Alternatively, the antennas 202 are able to have greater or smaller thicknesses. The tag circuitry 206 is able to be located on the inside of the antenna 202 on one side of the substrate 204. Alternatively, the circuitry 206 is able to be located in other positions on the side of the substrate 204 and/or on both sides of the substrate 204. The contact pads 208 are able to be used to connect each end of the antenna 202 to the circuitry 206 of the RFID tag 104. For example, the contact pads 208 are able to electrically couple with one or more chip pads of a microchip of the circuitry 206 (e.g. gold chip pads). As a result, the number of contact pads 208 is able to be adjusted to correspond to the number of antennas 202 and/or the number of circuitry 206 contacts. The circuitry 206 is able to comprise a non-transitory computer-readable memory that stores data. For example, the memory is able to store a unique identifier that is used to identify the printed circuit board 102. Additionally, the memory is able to store other information about the printed circuit board 102 and/or RFID tag 104 such as data about when and where they were manufactured as well as their components, operating requirements, and/or other types of data. Alternatively or additionally, the information in the memory is able to include a product identifier uniquely associated with one or more entries in a database that may be accessed to obtain information related to the product. This data is able to be read by the reader 106 when communicating with the tag 104. In some embodiments, the reader 106 is also able to add new data and/or edit the data on the tag 104. In other words, the memory is able to be read-write memory, read-only memory, write-once read-many memory or other types of memory.

As shown in FIG. 2, the antenna 202 is able to comprise a spiral coil comprising a plurality of straight sections that are disposed at angles of substantially 90 degrees from each other. Alternatively, although the antenna 202 is shown in the shape of a "square spiral," other configurations are contemplated (e.g., rectangular spiral, circular spiral, hexagonal spiral, other spirals, or other configurations). In some embodiments, the antenna 202 is made of copper. Alternatively, some or all of the antennas 202 are able to be made of one or more of copper, aluminum, plated metal, electrically conductive organic and inorganic materials, other types of material that are electrically conductive, or a combination thereof. Conventionally, the antennas 202 and/or circuitry 206 are protected with a solder mask, cover lay or alike coating, however, in some embodiments the antennas 202 are able to be uncoated by such a mask such that they are bare copper. This lack of coating is mitigated by the eventual covering of the tag 104 by the adhesive 112 and is able to reduce the cost of the tag 104. In some embodiments, the antennas 202 and/or circuitry 206 is able to be protected by organic solder preservative (OSP) of the first generation (e.g. using imidazoles or benzotriazoles). Alternatively, the antennas 202 and/or circuitry 206 is able to be protected by hot air solder leveling (HASL), electroless-nickel immersion gold (ENIG), immersion silver, immersion tin or other types of PCB finish alternatives. The RFID tag 104 is able to have a relatively small footprint (e.g., 5 mm by 5 mm square, or less), so that it is able to be attached or integrated into the printed circuit board 102 or other device without interfering with its intended use. Also, by utilizing a small tag 104, the cost of the RFID tag 104 is able to be relatively low since less material is required. In some embodiments, the tag 104 is configured to operate at a frequency of 13.56 MHz or greater. Alternatively, the tag 104 is able to operate at smaller frequencies. As shown in FIG. 2, the RFID tag 104 is a passive tag. Alternatively, the tag 104 is able to be active (having a battery the power active transmission), semi-passive (having a battery to run the circuitry 206, but not to power active transmission) or passive (having no battery).

In operation, the printed circuit board 102 and thus the embedded tag 104 is brought into a "read zone" established by the reader 106 such that the reader 106 is able to transmit an interrogating RF signal 99 that upon receipt is modulated by tag 104. For example, the reader 106 is able to generate a continuous wave (CW) electromagnetic disturbance at a certain (carrier) frequency, and this disturbance may be modulated by the RFID tag 104 to correspond to data that is to be communicated via the disturbance back to the reader 106. The modulated disturbance, or signal, is thereby able to communicate the information at a data rate that is lower than the carrier frequency. The RFID tag 104 is able to modulate the RF signal 99 in order to impart to the signal information stored within the RFID tag 104 and then transmit the modulated RF signal back to the reader 106. As a result, the information about the printed circuit board 102 is able to be easily read and used to uniquely identify the board 102 as well as determine other characteristics of the board 102 (e.g. type, creation date, creation location, tests performed). In some embodiments, the RFID tag 104 is able to be replaced by routing out the tag 104 from the cavity 110, optionally reading the data on the tag 104 and storing the read data on a replacement tag, and sealing the replacement tag in the cavity 110 in the same manner that the old tag 104 was sealed. The replacement ability provides the advantage of enabling defective or outdated tags to be replaced with new or updated tags without damaging or otherwise affecting the printed circuit boards 102.

Figure 3:
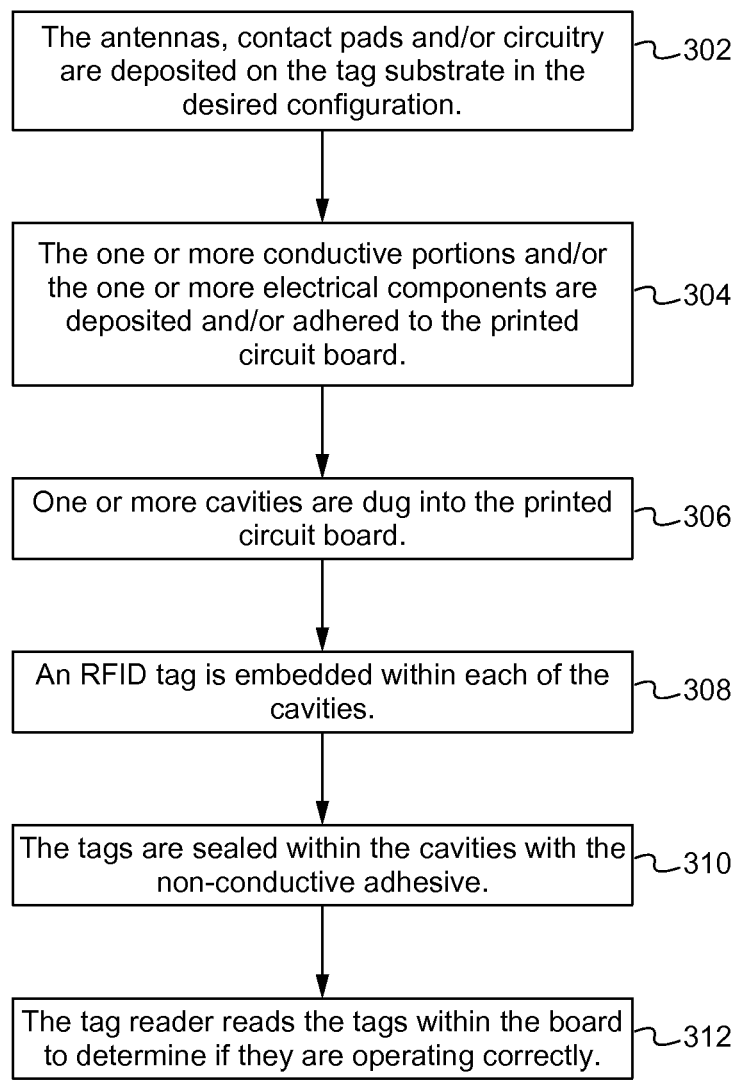
FIG. 3 illustrates a flow chart of a method of manufacturing an embedded high frequency RFID printed circuit board according to some embodiments.

FIG. 3 illustrates a flow chart of a method of manufacturing an embedded high frequency RFID printed circuit board according to some embodiments. At the step 302, the antennas 202, contact pads 208 and/or circuitry 206 are deposited on the tag substrate 204 in the desired configuration. In some embodiments, the antennas 202 (and/or contact pads 208) are deposited on the surface of the tag substrate 204 via photolithography or other deposition process. Alternatively, the antennas 202 (and/or contact pads 208) are able to be deposited on the surface of the tag substrate 204 by producing an engraved trench in the substrate 204 and then filling the trench with the material forming the antennas 202. In particular, the trench is able to form a desired pattern (e.g. a square spiral) on one or both sides of the substrate such that the antennas 202 when deposited within the trench will form the same pattern. The processes used for engraving the trenches is able to be one or more of laser ablation, hot embossing, molding, or other suitable processes. In embodiments where the antennas 202 are deposited on both sides of the substrate 204, step 302 further comprises producing one or more vias within substrate 204 such that the antennas 202 on either side of the substrate 204 are electrically coupled. The vias are able to be produced in substantially the same manner as the trenches. In some embodiments, step 302 is able to comprise depositing OSP or another PCB finisher on the circuitry 206, contact pads 208 and/or antennas 202. In some embodiments, step 302 comprises ensuring the antennas 202 are bare or uncoated by a solder mask, cover lay or other coating after step 302 such that they are bare when covered by the non-conductive adhesive as described below. In some embodiments, step 302 comprises affixing the tag circuitry 206 to the contact pads 208 and/or substrate 204 with a conductive adhesive material. In some embodiments, step 302 is able to be a reel-to-reel process in order to reduce costs. Alternatively, one or more portions of step 302 are able to be assembled with sheets.

At the step 304, the one or more conductive portions 105 and/or the one or more electrical components 108 are deposited and/or adhered to the printed circuit board 102. At the step 306, one or more cavities 110 are dug into the printed circuit board 102. The one or more cavities 110 are able to be dug within the circuit board 102 via laser, routing, photolithography, etching or other suitable digging methods. In some embodiments, digging the cavities 110 further comprises digging one or more holes that extend from the cavity 110 to the other side of the board 102 to allow air to be vented. This digging of the holes is able to be performed in substantially the same manner and at the same time as the digging of the cavity 110. Alternatively, a different method is able to be used to dig the holes at the same or a different time as the digging of the cavity 110. At the step 308, an RFID tag 104 is able to be embedded within each of the cavities 110. The tags 104 are able to be place manually or automatically within the cavities 110. In some embodiments, the tags 104 are initially pre-glued into place within the cavity 110. Alternatively, the tags 104 are able to be held temporarily in place with a vacuum or simply placed in the cavity 110 without anything holding the tag 104 in place.

At the step 310, the tags 104 are sealed within the cavities 110 with the non-conductive adhesive 112. In some embodiments, sealing the tags 104 with the adhesive 112 comprises fully or partially covering the tags 104 with the adhesive 112 and then immediately curing the adhesive 112 utilizing ultraviolet curing. Alternatively, one or more of ultraviolet curing, heat curing, other types of curing or a combination thereof is able to be used immediately or non-immediately. At the step 312, the tag reader 106 reads the tags 104 within the board 102 to determine if they are operating correctly. In some embodiments, the method further comprises pre-testing one or more of the tags 104 (and their components), circuitry 108, conductive portions 105 and/or remainder of the circuit board 102 to determine if they are operational before manufacturing them into the embedded high frequency RFID printed circuit boards. As a result, the method is able to provide the advantage of ensuring only non-faulty tags 104 and PCBs 102 are used thereby reducing costs.

The system, method and embedded high frequency RFID device described herein has numerous advantages. Specifically, the embedded RFID system enables each PCB to store data which gives each PCB sold to a customer a unique ID, which can be read over the life of the product. In particular, the embedded tag within the PCB is able to be read wirelessly and store data that is used to track the PCB through the entire production chain from the shipment stage all the way to the end product. The stored data is able to include how, when and where the PCB and/or chips on the PCB were tested, which can be used to determine the effectiveness of locations and testing procedures as well as locating faults that cause product defects. Further, the unique ID/stored information is able to be used to access PCB production, quality and/or serviceability data stored in a PCB database that references each unique ID to data about the PCB in which the tag is embedded. Finally, the system provides the advantage of embedding RFID tags into any injection molded object via the injection molding process. Specifically, the system enables direct use of the RFIDs into the mold while still hot because the tags are resistant to high temperatures.

The embedded RFID system has been described in terms of specific embodiments incorporating details to facilitate the understanding of the principles of construction and operation of the embedded RFID system. The specific configurations shown and the methodologies described in relation to the various modules and the interconnections there between are for exemplary purposes only. Such reference herein to specific embodiments and details thereof is not intended to limit the scope of the claims appended hereto. It will be apparent to those skilled in the art that modifications may be made in the embodiments chosen for illustration without departing from the spirit and scope of the embedded RFID system. For example, although the discussion above has related to embedding RFID tags within a PCB, it is contemplated that the same process is able to be used to embed RFID tags within other objects such as ink cartridges, glasses, vials or any injection molded product.

What is claimed is:

1. An RFID-embedded printed circuit board comprising:
a board having a non-conductive substrate and one or more conductive traces;
one or more electronic components coupled to the board, wherein the non-conductive substrate mechanically supports and the conductive traces electrically couple to the one or more electronic components; and
a high frequency RFID tag embedded within a cavity of the non-conductive substrate of the board, wherein the tag comprises a first antenna and a second antenna formed on opposite sides of a flexible tag substrate and electrically coupled together through the flexible tag substrate by a via.

2. The circuit board of claim 1, wherein the tag is affixed within the cavity with a cavity adhesive that couples the tag to the board.

3. The circuit board of claim 2, wherein the cavity adhesive surrounds at least the top of the tag to protect the tag and seal the tag within the cavity.

4. The circuit board of claim 1, wherein the tag comprises a RFID chip electrically coupled to the first and second antennas and the flexible tag substrate by a conductive adhesive.

5. The circuit board of claim 4, wherein the first and second antennas are uncoated on the flexible tag substrate such that the cavity adhesive is directly contacts the antennas.

6. The circuit board of claim 5, wherein the tag is a passive tag such that the tag is solely powered by incoming electromagnetic signals received by one or more of the antennas.

7. The circuit board of claim 6, wherein the cavity has a depth between 200 and 300 micrometers and the first and second antennas have a thickness between 5 and 10 micrometers.

8. The circuit board of claim 1, wherein the bottom of the cavity of the non-conductive substrate comprises one or more through holes that each create conduits from the cavity through the non-conductive substrate to the opposite side of the non-conductive substrate.

9. The circuit board of claim 1, wherein the tag stores an identifier that uniquely identifies the printed circuit board.

10. A method of manufacturing an embedded RFID printed circuit board, the method comprising:
providing a board comprising a non-conductive substrate and one or more conductive traces;
coupling one or more electronic components coupled to the board, wherein the non-conductive substrate mechanically supports and the conductive traces electrically couple to the one or more electronic components;
producing a cavity within the non-conductive substrate of the board; and
embedding a high frequency RFID tag within the cavity of the non-conductive substrate of the board, wherein the tag comprises a first antenna and a second antenna formed on opposite sides of a flexible tag substrate and electrically coupled together through the flexible tag substrate by a via.

11. The method of claim 10, further comprising affixing the tag within the cavity with a cavity adhesive that couples the tag to the board.

12. The method of claim 10, wherein the tag comprises a RFID chip electrically coupled to the first and second antennas and the flexible tag substrate by a conductive adhesive.

13. The method of claim 12, wherein the first and second antennas are uncoated on the flexible tag substrate such that the cavity adhesive is directly contacts the antennas.

14. The method of claim 13, wherein the tag is a passive tag such that the tag is solely powered by incoming electromagnetic signals received by one or more of the antennas.

15. The method of claim 14, wherein the cavity has a depth between 200 and 300 micrometers and the first and second antennas have a thickness between 5 and 10 micrometers.

16. The method of claim 10, further comprising forming one or more through holes in the bottom of the cavity of the non-conductive substrate that each form conduits from the cavity through the non-conductive substrate to the opposite side of the non-conductive substrate.

17. The method of claim 10, wherein the cavity adhesive surrounds at least the top of the tag to protect the tag and seal the tag within the cavity.

18. The method of claim 10, wherein the tag stores an identifier that uniquely identifies the printed circuit board.

19. The method of claim 10, further comprising testing the board, the electronic components and the tag for defects before coupling the embedding the tag within the board.

20. An RFID system comprising:
a board having a non-conductive substrate and one or more conductive traces;
one or more electronic components coupled to the board, wherein the non-conductive substrate mechanically supports and the conductive traces electrically couple to the one or more electronic components;
a high frequency RFID tag embedded within a cavity of the non-conductive substrate of the board and storing data, wherein the tag comprises a first antenna and a second antenna formed on opposite sides of a flexible tag substrate and electrically coupled together through the flexible tag substrate by a via; and
a tag reader that is able to read the data stored on the high frequency RFID tag.

21. The system of claim 20, wherein the tag is affixed within the cavity with a cavity adhesive that couples the tag to the board.

22. The system of claim 20, wherein the tag comprises a RFID chip electrically coupled to the first and second antennas and the flexible tag substrate by a conductive adhesive.

23. The system of claim 22, wherein the first and second antennas are uncoated on the flexible tag substrate such that the cavity adhesive is directly contacts the antennas.

24. The system of claim 23, wherein the tag is a passive tag such that the tag is solely powered by incoming electromagnetic signals received by one or more of the antennas.

25. The system of claim 24, wherein the cavity has a depth between 200 and 300 micrometers and the first and second antennas have a thickness between 5 and 10 micrometers.

26. The system of claim 20, wherein the bottom of the cavity of the non-conductive substrate comprises one or more through holes that each create conduits from the cavity through the non-conductive substrate to the opposite side of the non-conductive substrate.

27. The system of claim 20, wherein the cavity adhesive surrounds at least the top of the tag to protect the tag and seal the tag within the cavity.

28. The system of claim 20, wherein the data comprises an identifier that uniquely identifies the printed circuit board.

29. An RFID-embedded printed circuit board comprising:
a board having a non-conductive substrate and one or more conductive traces;
one or more electronic components coupled to the board, wherein the non-conductive substrate mechanically supports and the conductive traces electrically couple to the one or more electronic components; and
a high frequency RFID tag embedded within a cavity of the non-conductive substrate of the board, wherein a bottom of the cavity of the non-conductive substrate comprises one or more through holes that each create conduits from the cavity through the non-conductive substrate to the opposite side of the non-conductive substrate.

30. A method of manufacturing an embedded RFID printed circuit board, the method comprising:
providing a board comprising a non-conductive substrate and one or more conductive traces;
coupling one or more electronic components coupled to the board, wherein the non-conductive substrate mechanically supports and the conductive traces electrically couple to the one or more electronic components;
producing a cavity within the non-conductive substrate of the board;
forming one or more through holes in a bottom of the cavity of the non-conductive substrate that each form conduits from the cavity through the non-conductive substrate to the opposite side of the non-conductive substrate; and embedding a high frequency RFID tag within the cavity of the non-conductive substrate of the board.

31. An RFID system comprising:
a board having a non-conductive substrate and one or more conductive traces;
one or more electronic components coupled to the board, wherein the non-conductive substrate mechanically supports and the conductive traces electrically couple to the one or more electronic components;
a high frequency RFID tag embedded within a cavity of the non-conductive substrate of the board and storing data, wherein a bottom of the cavity of the non-conductive substrate comprises one or more through holes that each create conduits from the cavity through the non-conductive substrate to the opposite side of the non-conductive substrate; and
a tag reader that is able to read the data stored on the high frequency RFID tag.

* * * * *